United States Patent [19]
Kawaguchi

[11] Patent Number: 5,694,371
[45] Date of Patent: Dec. 2, 1997

[54] SYNCHRONOUS SEMICONDUCTOR CIRCUIT WITH OPERATION TIME MARGIN INCREASED

[75] Inventor: Manabu Kawaguchi, Tokyo, Japan

[73] Assignee: NEC Corporation, Tokyo, Japan

[21] Appl. No.: 724,820

[22] Filed: Oct. 2, 1996

[30] Foreign Application Priority Data

Nov. 22, 1995 [JP] Japan ..................... 7-328071

[51] Int. Cl.$^6$ ................................... G11C 7/00
[52] U.S. Cl. ..................... 365/233; 365/194; 326/96
[58] Field of Search .................... 365/233, 194, 365/191; 326/93, 96, 46, 28

[56] References Cited

U.S. PATENT DOCUMENTS

| | | | |
|---|---|---|---|
| 4,658,253 | 4/1987 | Johnson | 365/96 |
| 5,124,589 | 6/1992 | Shiomi et al. | 325/96 |
| 5,384,737 | 1/1995 | Childs et al. | 365/189.05 |
| 5,444,667 | 8/1995 | Obara | 365/194 |

FOREIGN PATENT DOCUMENTS 64-72394  3/1989  Japan .

*Primary Examiner*—Tan T. Nguyen
*Attorney, Agent, or Firm*—Sughrue, Mion, Zinn, Macpeak & Seas, PLLC

[57] ABSTRACT

A synchronous semiconductor device includes an asynchronous circuit receiving a sequence of data signals supplied in synchronous with a first clock signal and outputting a sequence of resultant data signals based on the sequence of data signals, an output circuit clock generating circuit for generating second and third clock signals having phases inverse to each other from the first clock signal, and an output synchronizing circuit for outputting the sequence of resultant data signals in synchronous with the first clock signal using the second and third clock signals. The output circuit clock generating circuit includes a frequency dividing circuit for dividing the first clock signal in frequency such that the second and third clock signals have a frequency twice of that of the first clock signal and phases inverse to each other. In this case, the output synchronizing circuit includes a first latching section for latching a first resultant data signals of the sequence in response to the second clock signal, a second latching section for latching a second resultant data signals of the sequence in response to the third clock signal, the sequence of resultant data signals being composed of the first resultant data signals and the second resultant data signals which are different from the first resultant data signals, and a selecting section for alternately selecting the resultant data signals from the first and second latching sections for every time interval corresponding to one period of the first clock signal in accordance with the second and third clock signals. The output circuit clock generating circuit further includes a delay circuit for delaying the first clock signal by a time interval corresponding to an operation time of the asynchronous circuit to supply the delayed first clock signal to the frequency dividing circuit. Also, the output synchronizing circuit further includes a delay circuit for delaying the second and third clock signals to be supplied to the selecting section by an operation time of the first and second latching sections.

20 Claims, 9 Drawing Sheets

SYNCHRONOUS SEMICONDUCTOR CIRCUIT WITH OPERATION TIME MARGIN INCREASED

BACKGROUND OF THE INVENTION

1. Field of the Invention

The present invention relates to a synchronous semiconductor circuit such as a synchronous semiconductor integrated logic circuit which operates at high speed in synchronous with an external clock signal.

2. Description of Related Art

There is a known a synchronous type semiconductor memory device as an example of a synchronous semiconductor circuit as described in Japanese Laid Open Patent disclosure (Show 64-72394).

FIG. 1 is a block diagram illustrating the structure of a first conventional semiconductor logic circuit which operates in synchronous with an external clock signal. In a first conventional semiconductor logic circuit shown in FIG. 1, an input signal D and an external clock signal CLK are inputted and an output signal Q is outputted. Referring to FIG. 1, the first conventional semiconductor logic circuit is composed of a D-type flip-flop circuit 61 as an input synchronizing circuit for receiving the input signal D in response to the external clock signal CLK to output a signal QI, a clock control circuit 64 for generating a clock signal CLK' from the clock signal CLK, an asynchronous logic circuit 62 which operates in asynchronous with the clock signal CLK, and receives the signal QI to perform a predetermined logic operation and then outputs a signal QL, and an output synchronizing circuit composed of a D-type flip-flop circuit 63 for latching the signal QL in response to the clock signal CLK' to output a signal Q. The clock control circuit 64 delays the clock signal CLK by a predetermined time period corresponding to the operation time period of the logic circuit 62 to generate the clock signal CLK' from the clock signal CLK.

Next, the operation of the first conventional semiconductor logic circuit will be described below. FIGS. 3A to 3D are timing charts to explain the operation of the first conventional semiconductor logic circuit. Data D (Dn, Dn+1 ...) shown in FIG. 3B are latched by the input synchronizing circuit 61 at the rising edge of the external clock signal CLK from the Low level to the High level for every cycle $t_{cyc}$ shown in FIG. 3A and then outputted to the logic circuit 62. The logic circuit 62 performs the predetermined logic operation to the data QI and outputs the logic operation result QL (Qn, Qn+1, Qn+2 ...) corresponding to the data D to the output synchronizing circuit 63, as shown in FIG. 3C. The clock control circuit 64 delays the external clock signal CLK by a predetermined time period corresponding to the operation time of the logic circuit 62 to generate the clock signal CLK' as shown in FIG. 3D. The logic operation result QL is latched by the output synchronizing circuit 63 in response to the rising edge of the clock signal CLK' in every cycle.

In this case, the time period $t_{AA}$ during which the output signal QL is output is influenced by the change in parameters such as a power supply voltage and a peripheral temperature and the variation of a manufacturing process. Assuming that the maximum output time period of the output signal QL is $t_{Amax}$ and the minimum output time period thereof is $t_{Amin}$, in a case where any operation cycle is taken into account, the time period $t_{(VAL)}$ during which the output signal QL is valid can be expressed by the following equation (1).

$$t_{(val)} = t_{cyc} - (t_{Amax} - t_{Amin}) \quad (1)$$

FIG. 2 is a block diagram illustrating a second conventional logic circuit which is composed of a plurality of asynchronous logic circuits and operates in a pipeline manner in synchronous with the external clock signal. Referring to FIG. 2, the second conventional logic circuit is composed of input synchronizing circuits 70-1 to 70-n which operate in synchronous with an external clock signal CLK, a first clock control circuit 80 for generating a clock signal CLK' from the external clock signal CLK, output synchronizing circuits 74-1 to 74-n which operate in synchronous with the clock signal CLK', a second clock control circuit 82 for generating a clock signal CLK" from the external clock signal CLK', and output synchronizing circuits 78-1 to 78-n 76-m which operate in synchronous with the clock signal CLK". Logic circuits 72-1 to 72-n which operate asynchronously with any clock signal are provided between the input synchronizing circuits 70-1 to 70-n and the output synchronizing circuits 74-1 to 74-n, respectively. Also, logic circuits 76-1 to 76-n which operate asynchronously with any clock signal are provided between the output synchronizing circuits 74-1 to 74-n and the output synchronizing circuits 78-1 to 78-n, respectively. Each of the input synchronizing circuits 70-1 to 70-n, output synchronizing circuits 74-1 to 74-n and 78-1 to 78-n is composed of a D-type flip-flop circuit. The first clock control circuit 80 delays the external clock signal CLK by the operation time period of the logic circuits 72-1 to 72-n to generate the clock signal CLK' and the second clock control circuit 82 delays the clock signal CLK' by the operation time period of the logic circuits 76-1 to 76-n to generate the clock signal CLK".

Next, the operation of the second conventional semiconductor logic circuit will be described below. FIGS. 4A to 4G are timing charts to explain the operation of the second conventional semiconductor logic circuit. The input synchronizing circuits 70-1 to 70-n latch data shown in FIG. 4B in response to the external clock signal shown in FIG. 4A to output to the logic circuits 72-1 to 72-n. The logic circuits 72-1 to 72-n perform the predetermined logic operation and outputs the operations results to the output synchronizing circuits 74-1 to 74-n. The first clock control circuit 80 delays the clock signal CLK by the operation time period of the logic circuits 72-1 to 72-n to generate the clock signal CLK' from the clock signal CLK. The output synchronizing circuits 74-1 to 74-n latch the outputs from the logic circuits 72-1 to 72-n in response to the clock signal CLK' to transfer to the logic circuits 76-1 to 76-n. The logic circuits 76-1 to 76-n perform the predetermined logic operation and outputs the operations results to the output synchronizing circuits 78-1 to 78-n. The second clock control circuit 82 delays the clock signal CLK' by the operation time period of the logic circuits 76-1 to 76-n to generate the clock signal CLK" from the clock signal CLK'. The output synchronizing circuits 78-1 to 78-n latch the outputs from the logic circuits 76-1 to 76-n in response to the clock signal CLK" to output them as outputs Qm-1 to Qm-n.

In FIGS. 4A to 4G, signal transfer delay times $t_{AA}$ from a time when the data is inputted to the input synchronizing circuits 70-1 to 70-n to a time when the data is outputted from the logic circuits 72-1 to 72-n are influence by changes in parameters such as a power supply voltage and a peripheral temperature, the variation in the manufacturing process of the semiconductor logic device. Also, there are differences between the signal transfer delay times due to the structure of the logic circuits. Further, there are differences in the signal transfer delay time due to the wiring length differences between an external clock input terminal and the input synchronizing circuits 70-1 to 70-n. The same can be applied to the clock signals CLK' and CLK" and the output synchronizing circuits 74-1 to 74-n and 78-1 to 78-n.

Assume that the minimum delay time is $t_{Amin}$ in, the maximum delay time is $t_{Amax}$, and the difference between the delay times due to wiring lengths is $t_{dm}$. Thus, the clock signal CLK is transferred to the input synchronizing circuits 70-1 to 70-n to have the minimum delay time as shown in FIG. 4C and the maximum delay time as shown in FIG. 4E. The outputs of the logic circuits 72-1 to 72-n are as shown in FIGS. 4D and 4F. In this case, the time period $t_{(val)}$ during which the output signal of the logic circuit operating in synchronous with the clock signal CLK is valid is given as the following equation (2).

$$t_{(val)} = t_{cyc} - (t_{Amax} - t_{Amin}) - 2(t_{dmax} - t_{dmin}) \qquad (2)$$

In the structure of the conventional synchronous semiconductor logic devices described above, the operation speed or operation time period is constrained for the following reason. Accordingly, there is a problem that the operation speed is slow. The reason will be described below.

In the logic circuit structure shown in FIG. 2, the signal valid time period $t_{(val)}$ of the output signal of the logic circuit 72 (72-1, ..., 72-n) which operates in synchronous with the external clock signal CLK is given as the above equation (2). The output signal of the logic circuit 72 as the front stage is inputted to a D-type flip-flop circuit 74 (74-1, ..., 74-n) as the output synchronizing circuit which operates in synchronous with the clock signal CLK' and transferred to the next stage logic circuit 76 (761, ..., 76-n). In order to operate the flip-flop circuit stably, the input signal must satisfy the standards of a signal setup time $t_{set}$ and the signal fold time $t_{hold}$ to the clock signal. Further, there are differences in wiring length from the first clock control circuit 80 to the flip-flop circuits. For this reason, differences are caused in the transfer times of the clock signal CLK' to the flip-flop circuits 74. Here, assume that the transfer delay time of the clock signal CLK' is $t_d$, the minimum delay time is $t_{d'min}$ and the maximum delay time is $t_{d'max}$. In this case, the output signal from the logic circuit 72 must satisfy the following equation (3) with respect to the signal set-up time $t_{set}$ and the signal hold time $t_{hold}$ to the clock signal CLK'.

$$t_{(val)} > (t_{set} + t_{hold} + (t_{d'-d-min})) \qquad (3)$$

The following equation (4) is derived from the above equations (2) and (3).

$$(t_{cyc} - (t_{Amax} - t_{Amin}) - 2(t_{dmax} - t_{dmin})) > (t_{set} + t_{hold} + (t_{d'max} - t_{d'min})) \qquad (4)$$

As seen from the equation (4), the increase of the operation speed of the synchronous logic circuit, i.e., the decrease of the operation time period $t_{cyc}$ is restricted because of different delay times of the logic circuits ($t_{Amax} - t_{Amin}$), the difference between the clock signal transfer times ($t_{dmax} - t_{dmin}$) and ($t_{d'max} - t_{d'min}$), the set-up time ($t_{set}$) and the hold time ($t_{hold}$) of the flip-flop circuit. That is, if the signal valid time period $t_{(val)}$ is made short for the increase of the operation speed, the operation margin (the setup time $t_{set}$ and the hold time $t_{hold}$) of the logic circuit to the synchronous clock signal CLK' cannot be sufficiently ensured. Also, the logic circuit at present is greatly influenced by the difference between the clock signal transfer times, ($t_{dmax} - t_{dmin}$) and ($t_{d'max} - t_{d'min}$), so that the increase of the operation speed tcyc is prevented.

Further, the increase of the scale of the logic circuit and as a result of this the increase of the laying-out area increase the wiring lengths for the clock signals CLK and CLK' so that the difference between clock signal transfer delay times ($t_{dmax} - t_{dmin}$) and ($t_{d'max} - t_{d'min}$) is made further larger. For this reason, the operation time period $t_{cyc}$ of the synchronous logic circuit is made long and it is not possible to speed up the operation of the logic circuit. In this case, a delay circuit is possible to be interposed on the signal transfer path which the transfer delay time of the clock signals CLK or CLK' is small so that the difference between the transfer delay times ($t_{dmax} - t_{dmin}$) or ($t_{d'max} - t_{d'min}$) can be made small to ensure the set-up time and the hold time. However, because the transfer delay times of the clock signal are matched to the slowest one, the delay time of the synchronous logic circuit is increased. This is contrary to the speeding-up of the operation.

As described above, in the conventional synchronous semiconductor logic devices, the increase of the operation speed shortens the output signal valid time period $t_{val}$ and reduces the operation margin. Also, the speeding-up of the operation of the logic circuit is restricted by the difference in the transfer delay time period of the clock signal.

SUMMARY OF THE INVENTION

Therefore, the present invention is made to solve the above problems. The present invention has, as an object, to provide a method and synchronous semiconductor logic device in which the operation speed can be increased and a sufficient operation margin to a clock signal supplied to a following logic circuit can be provided.

Another object of the present invention is to provide a method and synchronous semiconductor logic device in which the restriction of the clock signal input timing is removed.

In order to achieve an aspect of the present invention, a synchronous semiconductor device includes an asynchronous circuit receiving a sequence of data signals supplied in synchronous with a first clock signal and outputting a sequence of resultant data signals based on the sequence of data signals, an output circuit clock generating circuit for generating second and third clock signals having phases inverse to each other from the first clock signal, and an output synchronizing circuit for outputting the sequence of resultant data signals in synchronous with the first clock signal using the second and third clock signals.

In this case, the output synchronizing circuit holds each resultant data signal for a time interval corresponding to twice of one period of the first clock signal, and selectively outputs the sequence of resultant data signals one by one for every time interval corresponding to one period of the first clock signal. For this purpose, the output circuit clock generating circuit includes a frequency dividing circuit for dividing the first clock signal in frequency such that the second and third clock signals have a frequency twice of that of the first clock signal and phases inverse to each other. Also, the output synchronizing circuit includes a first latching section for latching a first resultant data signals of the sequence in response to the second clock signal, a second latching section for latching a second resultant data signals of the sequence in response to the third clock signal, the sequence of resultant data signals being composed of the first resultant data signals and the second resultant data signals which are different from the first resultant data signals, and a selecting section for alternately selecting the resultant data signals from the first and second latching sections for every time interval corresponding to one period of the first clock signal in accordance with the second and third clock signals.

The output circuit clock generating circuit may further include a delay section for delaying the first clock signal by a time interval corresponding to an operation time of the asynchronous circuit to supply the delayed first clock signal to the frequency dividing circuit. Alternatively, the output synchronizing circuit may further include a delay section for delaying the second and third clock signals to be supplied to the selecting section by an operation time of the first and second latching sections.

The synchronous semiconductor device may further include an input synchronizing circuit for latching the sequence of data signals in response to the first clock signal such that the sequence of latched data signals is supplied to the asynchronous circuit in synchronous with the first clock signal or may further include an input circuit clock generating circuit for delaying a fourth clock signal to generate the first clock signal from the fourth clock signal.

Note that in the above description, the asynchronous circuit is a logic circuit or a semiconductor random access memory.

In order to achieve another aspect of the present invention, a synchronous apparatus comprising a plurality of synchronous semiconductor devices connected in parallel, each of which includes an asynchronous circuit receiving a sequence of data signals supplied in synchronous with a first clock signal and outputting a sequence of resultant data signals based on the sequence of data signals, an output circuit clock generating circuit for generating second and third clock signals having phases inverse to each other from the first clock signal, and an output synchronizing circuit for outputting the sequence of resultant data signals in synchronous with the first clock signal using the second and third clock signals.

In order to achieve still another aspect of the present invention, a synchronous apparatus comprising a plurality of synchronous semiconductor devices connected in series, each of which includes an input circuit clock generating circuit for delaying a clock signal supplied from a preceding semiconductor device by a predetermined time interval to generate the first clock signal from the clock signal, an input synchronizing circuit for latching a sequence of data signals supplied from the preceding semiconductor device in synchronous with the first clock signal, an asynchronous circuit receiving a sequence of data signals and outputting a sequence of resultant data signals based on the sequence of data signals, an output circuit clock generating circuit for generating a second clock signal from the first clock signal, and an output synchronizing circuit for latching each resultant data signal for a time interval corresponding to twice of one period of the clock signal supplied from the preceding semiconductor device and selectively outputting the sequence of resultant data signals in synchronous with the clock signal for every time period corresponding to one period of the clock signal. In this case, the output circuit clock generating circuit for generating the second clock signal from the first clock signal and outputting the second clock signal as the clock signal to a subsequent semiconductor device.

In order to yet still another aspect of the present invention, a synchronous semiconductor device includes an asynchronous circuit receiving a sequence of data signals supplied in synchronous with a first clock signal and outputting a sequence of resultant data signals based on the sequence of data signals, an output circuit clock generating circuit for generating a second clock signal from the first clock signal, and an output synchronizing circuit for latching each resultant data signal for a time interval corresponding to twice of one period of the clock signal supplied from the preceding semiconductor device and selectively outputting the sequence of resultant data signals in synchronous with the clock signal for every time period corresponding to one period of the clock signal.

DESCRIPTION OF THE PREFERRED EMBODIMENTS

The synchronous semiconductor circuit of the present invention will be described with reference to the accompanying drawings.

Figure 5:
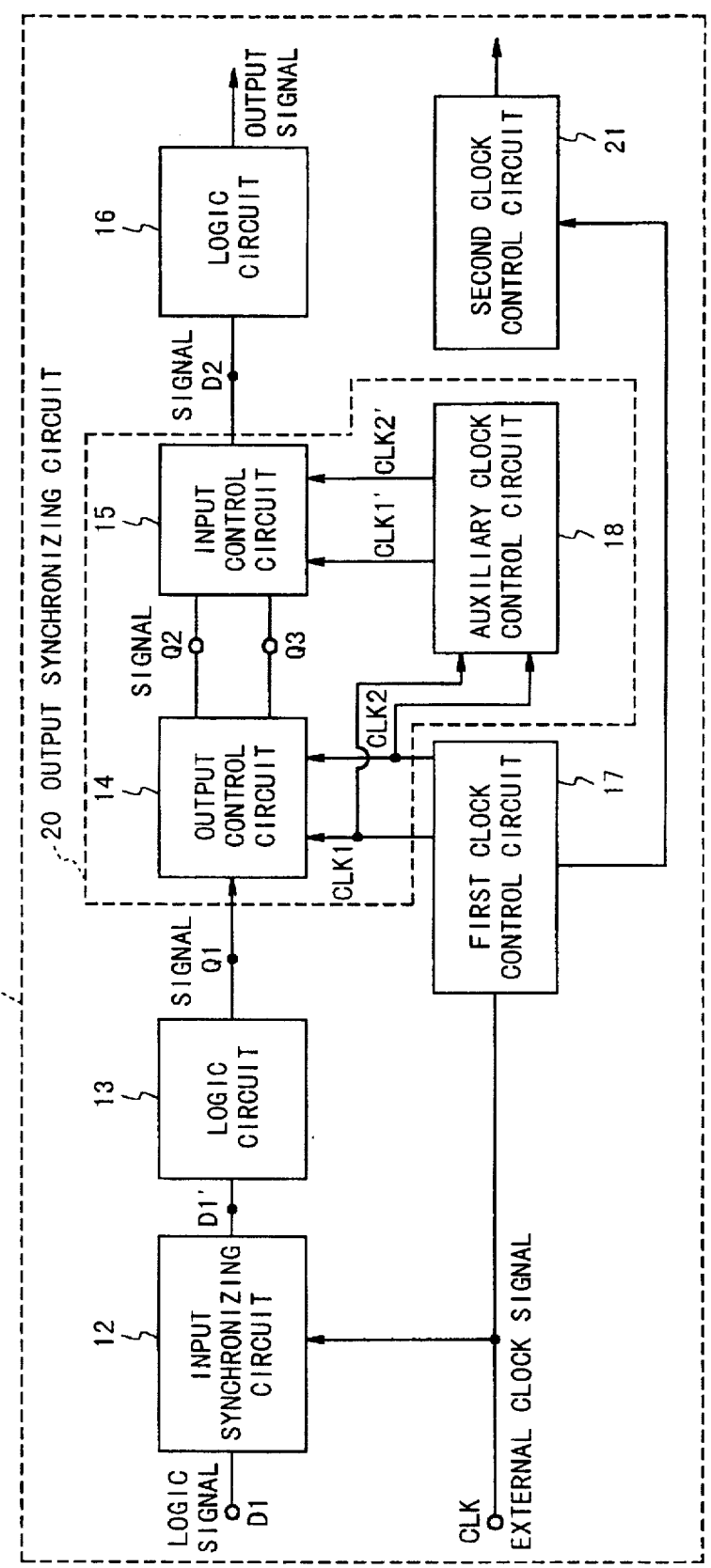
FIG. 5 is a block diagram illustrating the structure of a synchronous semiconductor circuit according to a first embodiment of the present invention.

FIG. 5 illustrate the structure of the synchronous semiconductor circuit such as a synchronous logic circuit according to the first embodiment of the present invention. Referring to FIG. 5, the synchronous logic circuit 11 is composed of an input synchronizing circuit 12, asynchronous circuit such as a logic circuit 13, output synchronizing circuit 20, asynchronous circuit such as a logic circuit 16, first clock control circuit 17, and a second clock control circuit 21. The output synchronizing circuit 20 is composed of an output control circuit 14, input control circuit 15, and auxiliary clock control circuit 18. A logic signal D1 and an external synchronous clock signal CLK are inputted to the synchronous semiconductor circuit 11. A d-type flip-flop circuit 12 as the input synchronizing circuit inputs the logic signal D1 in response to the external clock signal CLK and outputs a synchronized logic signal D1' to the logic circuit 13. The logic circuit 13 performs a predetermined logic operation and outputs the logic operation output signal Q1 to the output control circuit 14. The first clock control circuit 17 generates clock signals CLK1 and CLK2 from the external clock signal CLK to supply to the output control circuit 14. The clock signals CLK1 and CLK2 have opposite phases to each other as differential output clock signals and a time period twice of that of the clock signal CLK. That is, the first clock control circuit 17 divides the clock signal CLK twice in frequency. The output control circuit 14 latches the output signal Q1 from the logic circuit 13 in response to the clock signals CLK1 and CLK2 to output signals Q2 and Q3 to the input control circuit 15, respectively. The output signals Q2 and Q3 are valid during a time period twice of a period of the clock signal CLK. The second clock control circuit 18 receives the clock signals CLK1 and CLK2 and generates clock signals CLK1' and CLK2' to supply to the input control circuit 15. The input control circuit 15 selectively and sequentially outputs the output signals Q2 and Q3 to the logic circuit 16 as an output signal D2 in response to the clock signals CLK1' and CLK2'. The logic circuit 16 performs a predetermined logic operation to the output signal D2 from the input control circuit 15. The second clock control circuit 21 receives the clock signal CLK1 or CLK2 or both to generate the clock signals CLK3 and CLK4.

Figure 6:
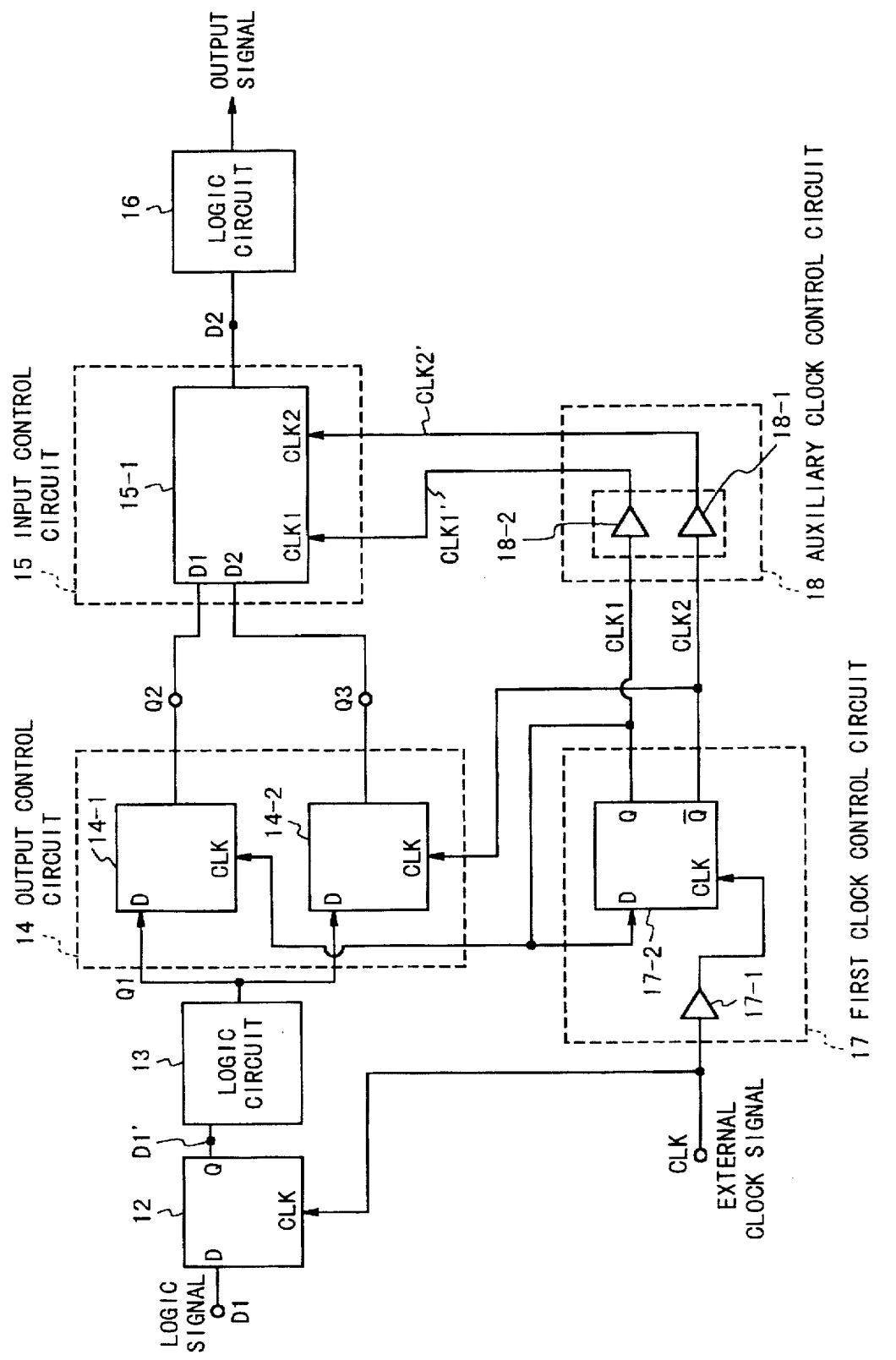
FIG. 6 is a block diagram illustrating the detailed structure of the synchronous semiconductor circuit according to the first embodiment of the present invention.

FIG. 6 shows the detailed structure of the synchronous semiconductor circuit according the first embodiment of the present invention. In FIG. 6, the same reference numerals are assigned to the same components as those in FIG. 5. Also, the second clock control circuit 21 is omitted. Referring to FIG. 6, the input synchronizing circuit 12 is composed of a D-type flip-flop circuit 12. The first clock control circuit 17 is composed of a delay circuit 17-1 and a D-type flip-flop circuit 17-2. The delay circuit 17-1 has a delay time corresponding to a time interval during which the logic circuit 13 processes the signal D1', i.e., a signal delay time in the logic circuit 13, and delays the clock signal CLK by the delay time. The delay circuit 17-1 can be composed of a general purpose buffer circuit. The flip-flop circuit 17-2 has the Q output connected to the D input terminal and divides the clock signal CLK in frequency. Thus, the clock signals CLK1 and CLK2 having the frequency which is twice of that of the clock signal CLK are outputted from the Q and Q* terminals ("*" indicates the inversion). The output control circuit 14 is composed of D-type flip-flop circuits 14-1 and 14-2 which latch the output signal Q1 in response to the clock signals CLK1 and CLK2, respectively. The input control circuit 15 is composed of a selector 15-1. The selector 15-1 selects one of the output signals Q2 and Q3 from the flip-flop circuits 14-1 and 14-2 in accordance with which of the differential clock signals CLK1' and CLK2' is in the High level. The auxiliary clock control circuit 18 is composed of two delay circuits 18-1 and 18-2. The delay time of each of the delay circuits 18-1 and 18-2 is determined based on the operation margin of the selector 15-1 and each delay circuit may be composed of a general purpose buffer circuit.

Next, the operation of the semiconductor logic circuit according to the first embodiment of the present invention will be described.

Figure 7:
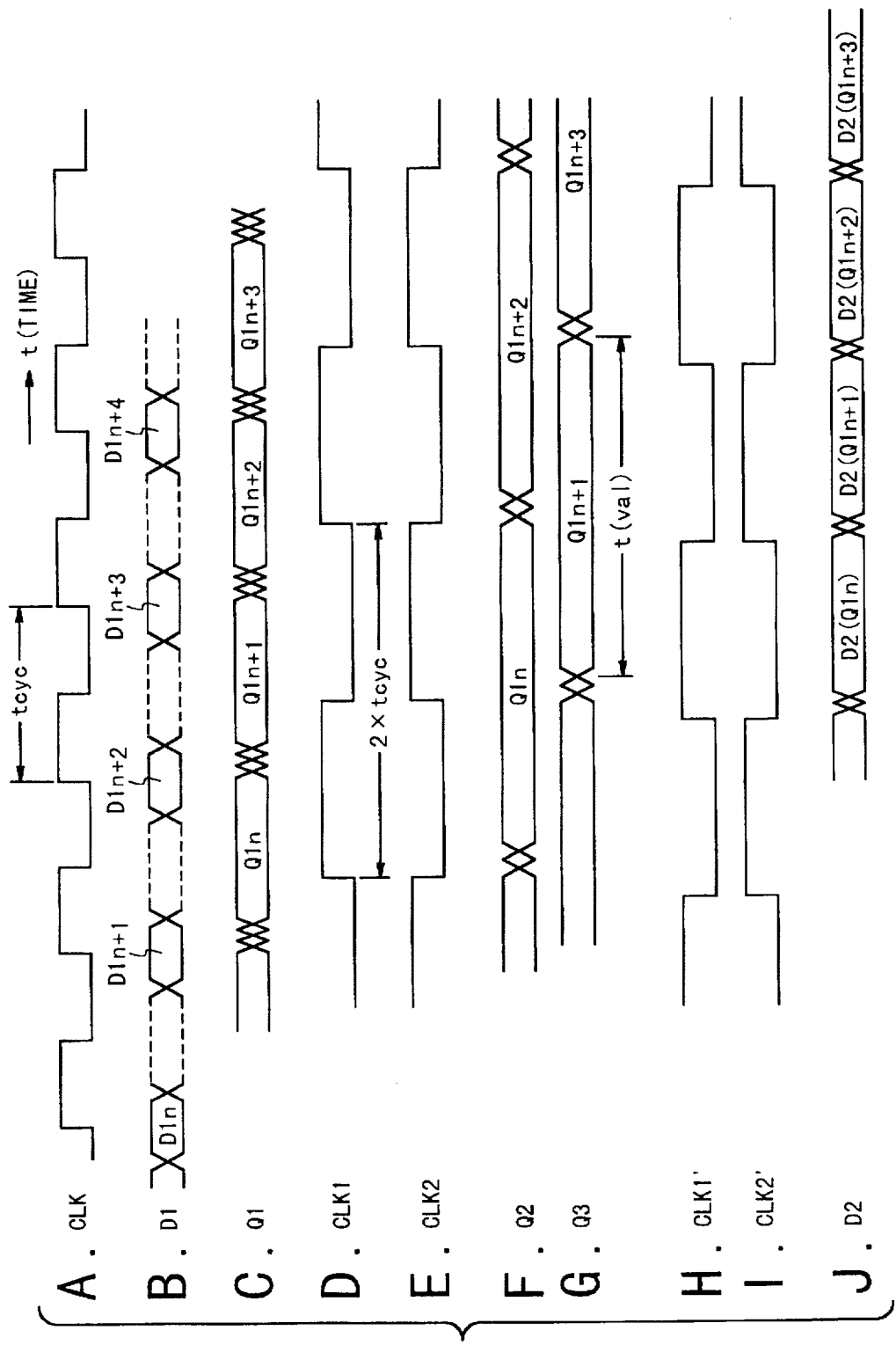
FIGS. 7A to 7J are timing charts to explain the operation of the synchronous semiconductor circuit according to the first embodiment of the present invention.

The external clock signal CLK and the logic signal D1 (D1n, D1n+1 ...) are inputted to the flip-flop circuit 12. The flip-flop circuit 12 latches the logic signal D1 shown in FIG. 7B at the timing of the rising edge of the clock signal CLK shown in FIG. 7A and outputs the signal Q1 (Q1n, Q1n+1, ...) to the flip-flop circuits 14-1 and 14-2 as shown in FIG. 7C. The delay circuit 17-1 delays the clock signal CLK by a time period corresponding to the operation time of the logic circuit 13 and supplies to the flip-flop circuit 17-2. The flip-flop circuit 17-2 divides the delayed clock signal CLK to generate the clock signals CLK1 and CLK2 having the frequency twice of that of the clock signal CLK, i.e., a time period twice of that of the clock signal CLK. The clock signals CLK1 and CLK2 are outputted from the Q terminal and Q* terminal as shown in FIGS. 7D and 7E. That is, the clock signals CLK1 and CLK2 are a differential clock signal. The clock signals CLK1 and CLK2 are supplied to the flip-flop circuits 14-1 and 14-2 and the delay circuits 18-1 and 182, respectively.

The flip-flop circuit 14-1 latches the logic signal Q1n, Q1n1+2 , ... in response to the clock signal CLK1 and the flip-flop circuit 14-2 latches the logic signal Q1n+1, Q1n+3, ... in response to the clock signal CLK2. Then, the flip-flop circuits 14-1 and 14-2 hold the latched data during the time period twice of the that of the clock signal CLK. The logic data held in the flip-flop circuits 14-1 and 14-2 are outputted to the selector 15-1 as the data Q2 and Q3 as shown in FIGS. 7F and 7G.

The delay circuit 18-1 and 18-2 delay the clock signals CLK1 and CLK2 to take account for the operation time periods of the flip-flop circuit 14-1 and 14-2 such that the selector ensures the sufficient operation time margin and then output the clock signals CLK1' and CLK2', as shown in FIGS. 7H and 7I, respectively. The selector 15-1 selects one of the data Q2 and Q3 based on the clock signals CLK1' and CLK2'. In the first embodiment, since the clock signal CLK1' is first in the High level, the data Q1n is selected. Then, when the clock signal CLK2' goes to the high level, the data Q1n+1 is selected. Thus, the data held in the flip-flop circuits 14-1 and 14-2 are alternately outputted. The selected data is outputted as the data D2 as shown in FIG. 7J. Thus, the selected data is outputted during a time period when the clock signal is in the High level, i.e., for one time period $t_{cyc}$ of the clock signal CLK.

The signal effective time $t_{(val)}$ of the output signals Q2 and Q3 from the flip-flop circuits 14-1 and 14-2 are expressed by the following equation (5).

$$t_{(val)}=2t_{cyc}-(t_{Amax}-t_{Amin})-2(t_{dmax}-t_{dmin}) \qquad (5)$$

Figure 1:
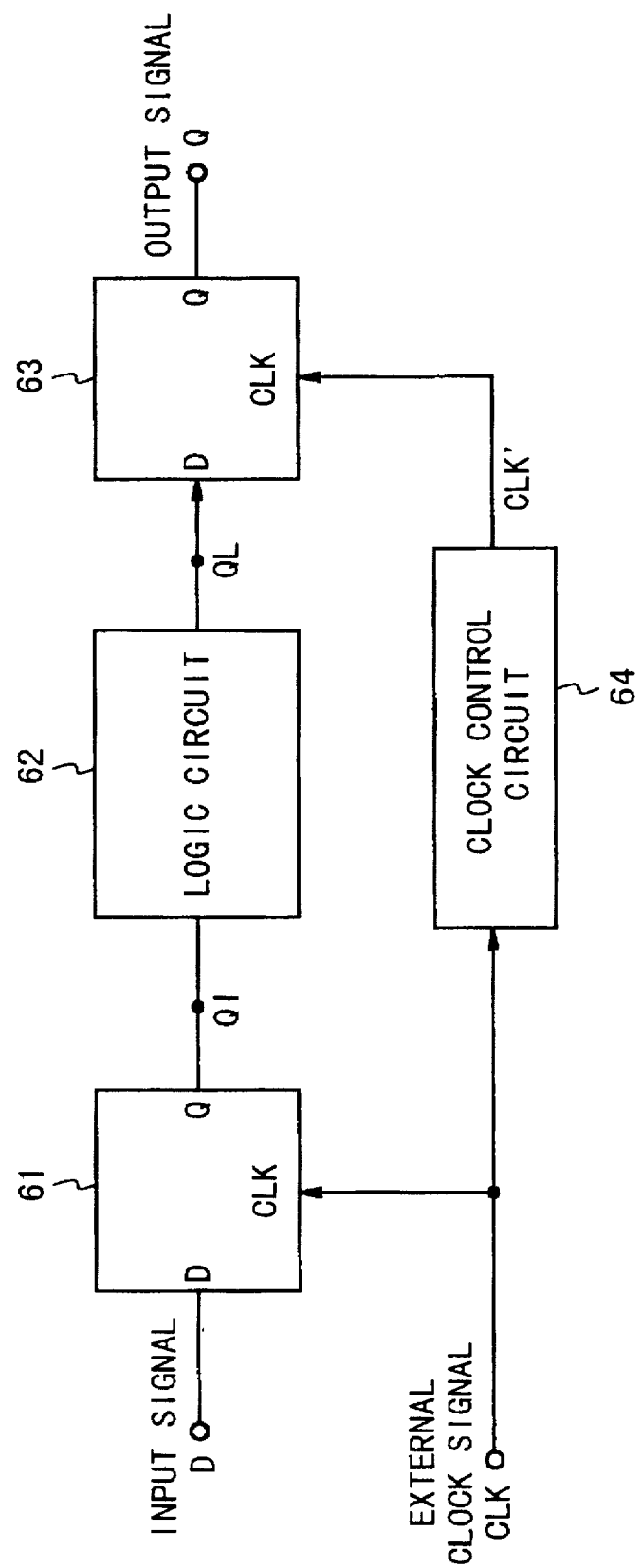
FIG. 1 is a block diagram illustrating the structure of a first conventional synchronous logic circuit.
Figure 2:
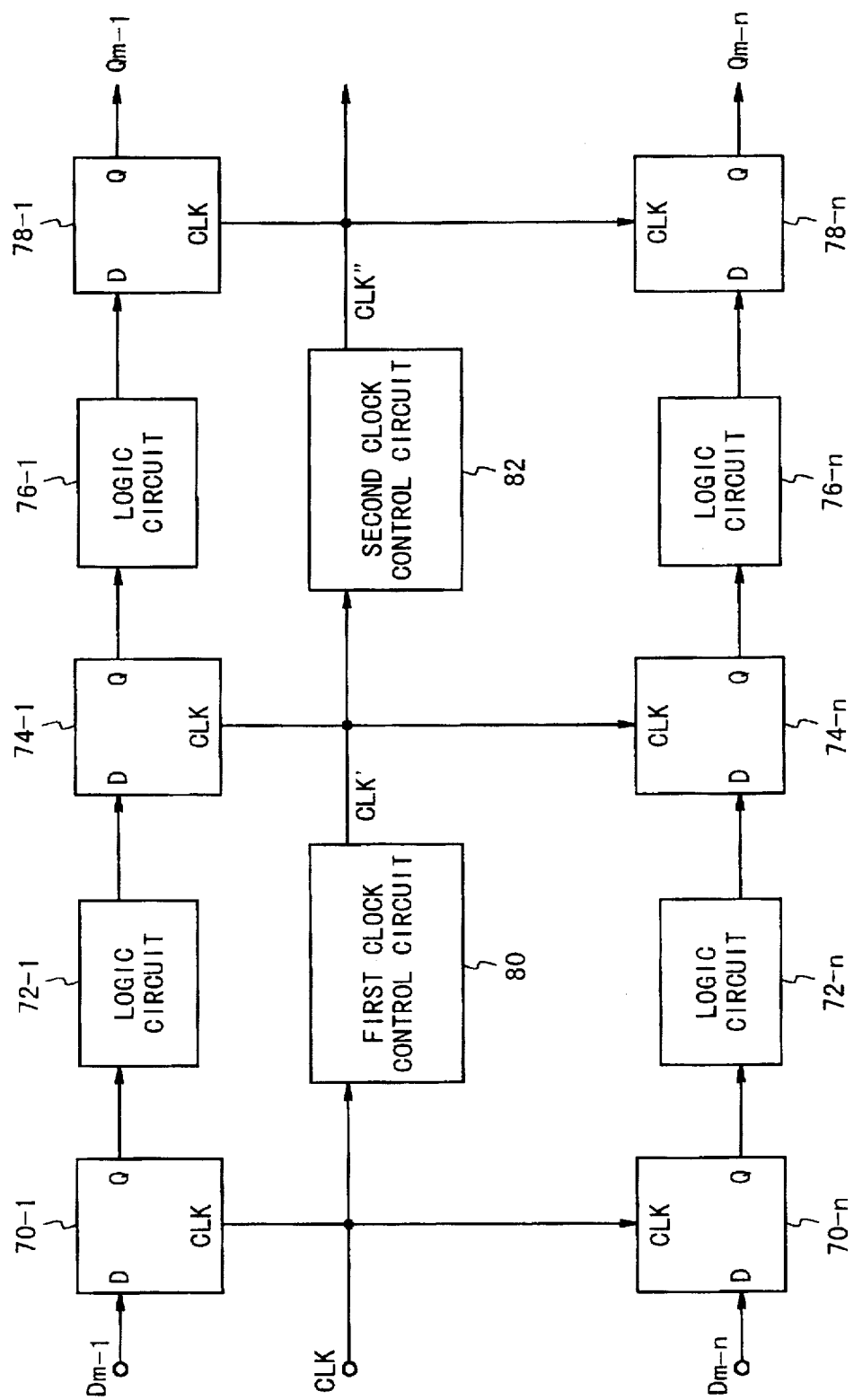
FIG. 2 is a block diagram illustrating the structure of a second conventional synchronous logic circuit.
Figure 3:
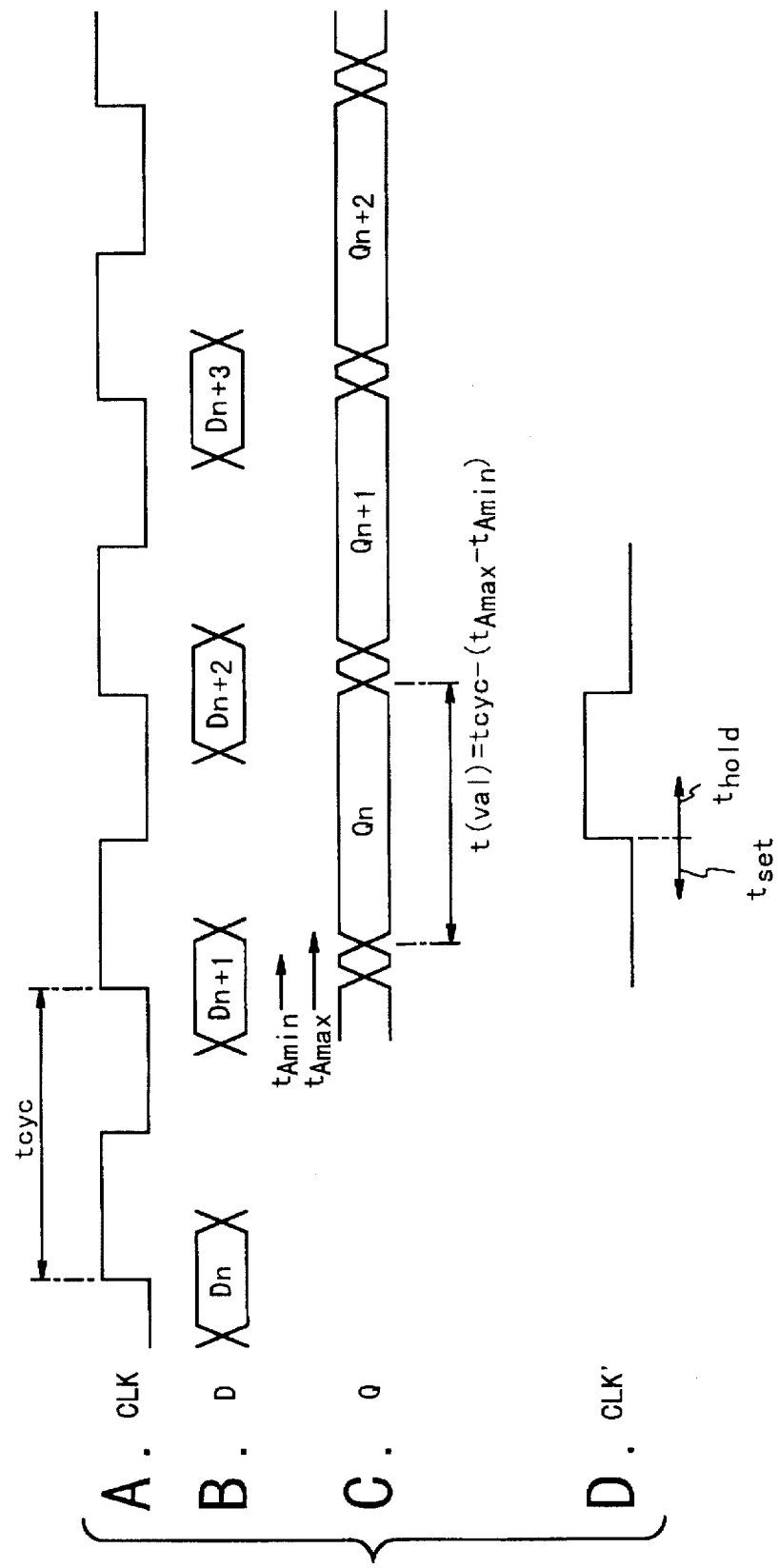
FIGS. 3A to 3D are timing charts to explain the operation of the first conventional synchronous logic circuit.

As seen from the equation (5) and the timing charts shown in FIGS. 7A to 7J, in the first embodiment, the signal valid time $t_{val}$ of the output signals Q2 and Q3 is increased by one cycle time $t_{cyc}$ of the clock signal CLK, compared to the conventional semiconductor logic circuit shown in FIG. 2. Therefore, when the signal D2 is synchronously latches by the next stage logic circuit 16, the operation time margin (a set-up time and a hold time) is sufficiently ensured for the synchronous differential clock signals CLK1' and CLK2'.

Figure 4:
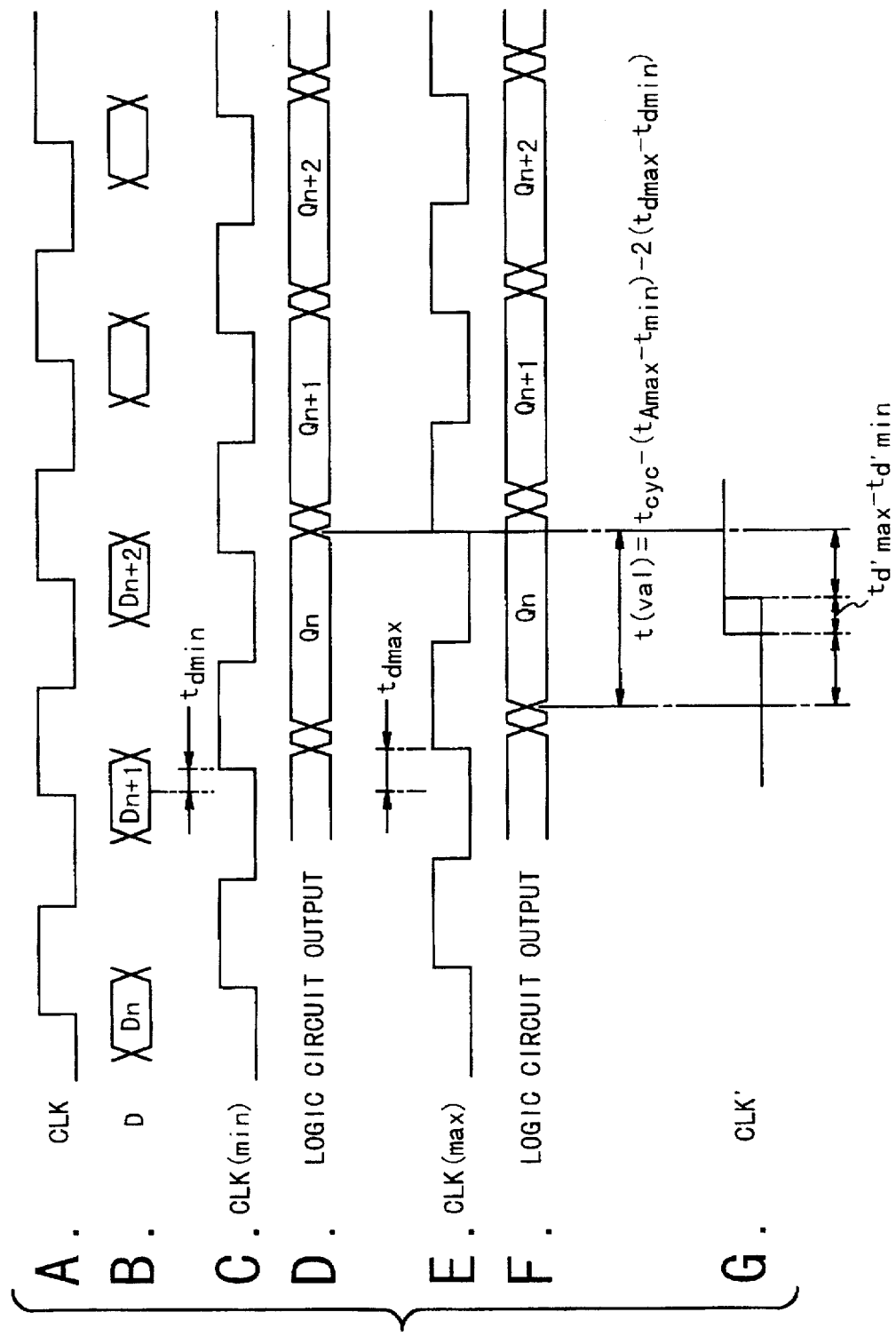
FIGS. 4A to 4G are timing charts to explain the operation of the second conventional synchronous logic circuit.
Figure 8:
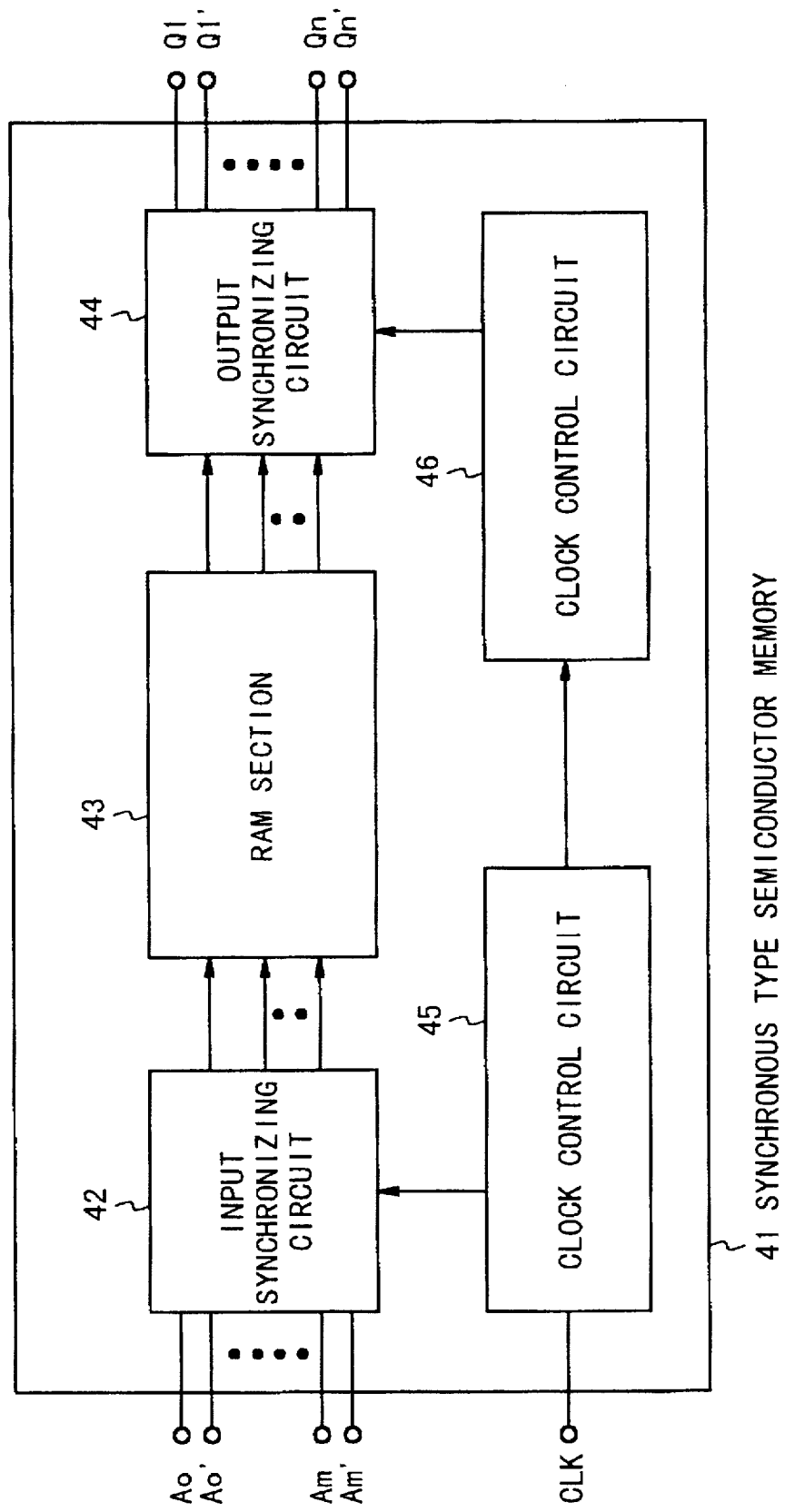
FIG. 8 is a block diagram illustrating the structure of a synchronous semiconductor circuit according to a second embodiment of the present invention.

Next, the synchronous semiconductor circuit according to the second embodiment of the present invention will be described with reference to FIG. 8. FIG. 8 shows the structure of a synchronous semiconductor memory circuit as the synchronous semiconductor circuit according to the second embodiment of the present invention. Referring to FIG. 4, the synchronous semiconductor memory circuit 41 is composed of an input synchronizing circuit 42, random access memory (RAM) section 43, output synchronizing circuit 44, clock control circuits 45 and 46. The input synchronizing circuit 42, output synchronizing circuit 44, and clock control circuit 46 correspond to the input synchronizing circuit 12, output synchronizing circuit 20 and first clock control circuit 17, respectively. The RAM section 43 includes an memory cell array, row decoder, column decoder, sense amplifiers and so on all of which are not shown. The clock control circuit 45 delays an external clock signal CLK by a predetermined time period to generate an internal clock signal output. The internal clock signal is outputted to the input synchronizing circuit 42. When a plurality of synchronous semiconductor circuits are connected in series, the predetermined time period is determined based on the delay time of a circuit portion provided between the clock control circuit of the synchronous semiconductor circuit of an immediately previous stage and the clock control circuit 45 of the synchronous semiconductor circuit of the current stage. Alternatively, the clock control circuit 45 may be constituted in the same manner as the clock control circuit 17 of FIG. 6. In this case, the input synchronizing circuit is desirably constituted in the same manner as the output synchronizing circuit 20. The two clock signals generated by the clock control circuit 45 may be supplied to the clock control circuit 46.

Figure 9:
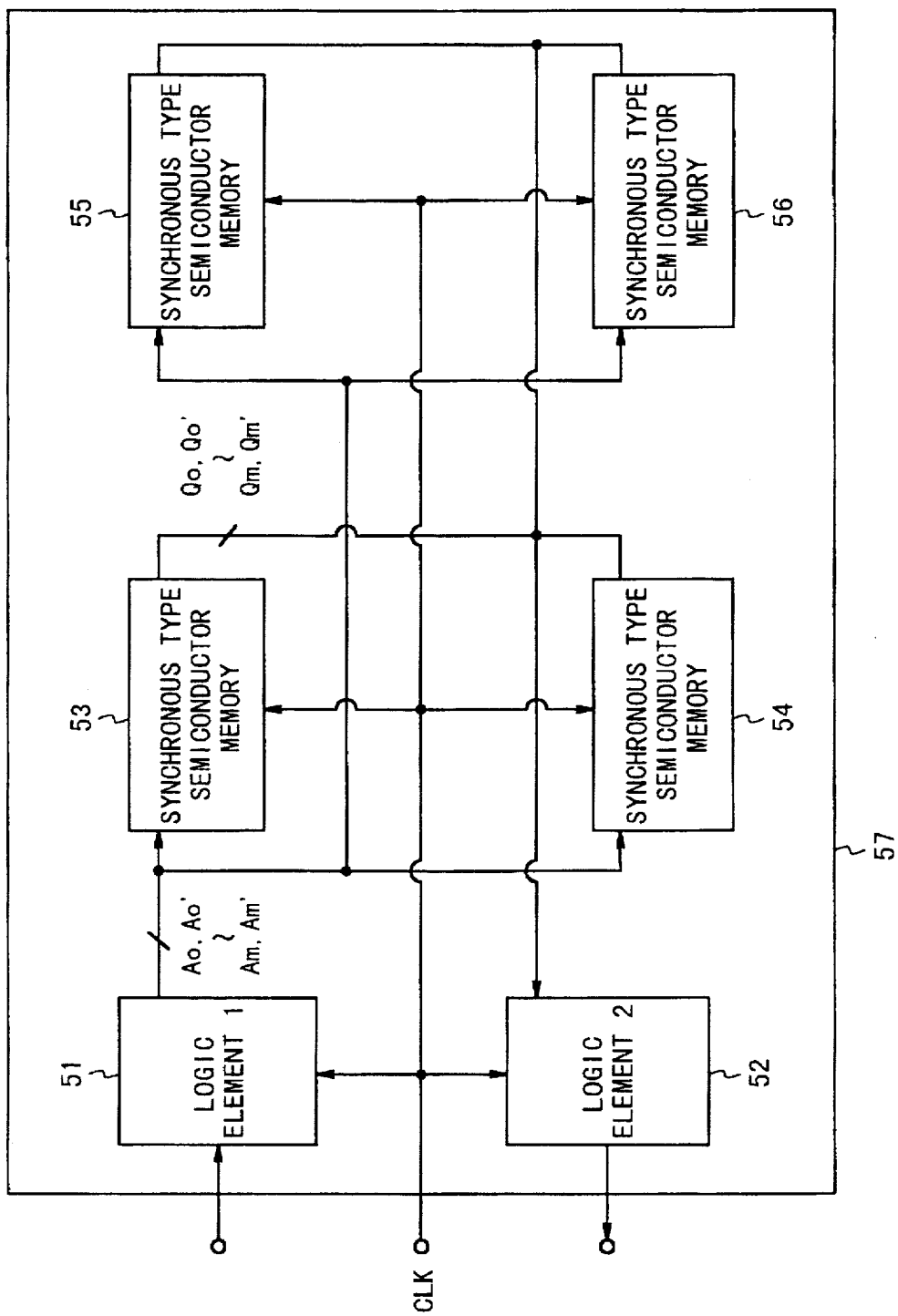
FIG. 9 is a block diagram illustrating the structure of the board on which the synchronous semiconductor circuits according to the first and second embodiments of the present invention are mounted.

Next, FIG. 9 is circuit diagram illustrating a circuit board composed of a plurality of synchronous type semiconductor memory circuits each of which is shown in FIG. 8 and logic elements 51 and 52. In a case where the plurality of synchronous type semiconductor memory circuits are mounted on a single circuit board, the lengths of the wirings of clock signal and data signals from one semiconductor logic element to the semiconductor memory circuits are different from each other depending upon the locations of the semiconductor logic element and semiconductor memory circuits. In the above-mentioned conventional synchronous semiconductor circuit, when the output signal of the semiconductor memory circuit is synchronously inputted to the logic circuit of the next stage, it is difficult to ensure the operation time margin to the clock signal. In order to ensure the operation time margin, the operation speed must be decreased or the period of the clock signal must be elongated.

In the synchronous semiconductor logic circuit and/or synchronous semiconductor memory circuit to which the present invention is applied for the input synchronizing circuit and/or the output synchronizing circuit, the output signal valid time of the synchronous semiconductor circuit is about twice of that of the above-mentioned conventional circuit. Therefore, the operation time margin can be ensured sufficiently in the timing design of the synchronous clock signal and there is an effect that the circuit design becomes easy for the board circuit designer. Also, when the operation time margin to the synchronous clock signal is ensured in the same manner as in the convention example, the present invention has the effect that it is possible to make the operation speed fast about twice.

As described above, according to the present invention, the output signal valid time from the logic circuit which operates in synchronous with the clock signal can be held during a twice time period compared to that in the conventional circuit structure, i.e., during two cycles of the clock signal. For this reason, when the output signal is inputted to the next stage logic circuit, there is twice the operation time margin to the clock signal compared to the that of the conventional circuit structure. Therefore, the timing design can be performed easily by a circuit designer, and there is the effect that the enough design margin can be ensured.

Further, as seen from the equation (5), if the operation time margin is the same as that of the convention circuit structure, the operation speed can be set to be about ½ of the operation time of the convention semiconductor circuit in the present invention.

What is claimed is:

1. A synchronous semiconductor device comprising:
   an asynchronous circuit receiving a sequence of data signals supplied in synchronous with a first clock signal and outputting a sequence of resultant data signals based on the sequence of data signals;
   an output circuit clock generating circuit for generating second and third clock signals having phases inverse to each other from said first clock signal; and
   an output synchronizing circuit for outputting the sequence of resultant data signals in synchronous with said first clock signal using said second and third clock signals.

2. A synchronous semiconductor device according to claim 1, wherein said output synchronizing circuit holds each resultant data signal for a time interval corresponding to twice of one period of said first clock signal, and selectively outputs the sequence of resultant data signals one by one for every time interval corresponding to one period of said first clock signal.

3. A synchronous semiconductor device according to claim 1, wherein said output circuit clock generating circuit includes a frequency dividing circuit for dividing said first clock signal in frequency such that said second and third clock signals have a frequency twice of that of said first clock signal and phases inverse to each other, and
   wherein said output synchronizing circuit includes:
   first latching means for latching a first resultant data signals of the sequence in response to said second clock signal;
   second latching means for latching a second resultant data signals of the sequence in response to said third clock signal, the sequence of resultant data signals being composed of the first resultant data signals and the second resultant data signals which are different from the first resultant data signals; and
   selecting means for alternately selecting the resultant data signals from said first and second latching means for every time interval corresponding to one period of said first clock signal in accordance with said second and third clock signals.

4. A synchronous semiconductor device according to claim 3, wherein said output circuit clock generating circuit further includes delay means for delaying said first clock signal by a time interval corresponding to an operation time of said asynchronous circuit to supply the delayed first clock signal to said frequency dividing circuit.

5. A synchronous semiconductor device according to claim 3, said output synchronizing circuit further includes delay means for delaying said second and third clock signals to be supplied to said selecting means by an operation time of said first and second latching means.

6. A synchronous semiconductor device according to claim 1, further comprising an input synchronizing circuit for latching the sequence of data signals in response to said first clock signal such that the sequence of latched data signals is supplied to said asynchronous circuit in synchronous with said first clock signal.

7. A synchronous semiconductor device according to claim 6, further comprising an input circuit clock generating circuit for delaying a fourth clock signal to generate said first clock signal from the fourth clock signal.

8. A synchronous semiconductor device according to claim 1, wherein said asynchronous circuit is a logic circuit.

9. A synchronous semiconductor device according to claim 1, wherein said asynchronous circuit is a semiconductor random access memory.

10. A synchronous apparatus comprising a plurality of synchronous semiconductor devices connected in parallel, each of which comprises:
   an asynchronous circuit receiving a sequence of data signals supplied in synchronous with a first clock signal and outputting a sequence of resultant data signals based on the sequence of data signals;
   an output circuit clock generating circuit for generating second and third clock signals having phases inverse to each other from said first clock signal; and
   an output synchronizing circuit for outputting the sequence of resultant data signals in synchronous with said first clock signal using said second and third clock signals.

11. A synchronous apparatus comprising a plurality of synchronous semiconductor devices connected in series, each of which comprises:

an input circuit clock generating circuit for delaying a clock signal supplied from a preceding semiconductor device by a predetermined time interval to generate a first clock signal from the clock signal;

an input synchronizing circuit for latching a sequence of data signals supplied from said preceding semiconductor device in synchronous with said first clock signal;

an asynchronous circuit receiving a sequence of data signals and outputting a sequence of resultant data signals based on the sequence of data signals;

an output circuit clock generating circuit for generating a second clock signal from said first clock signal; and an output synchronizing circuit for latching each resultant data signal for a time interval corresponding to twice of one period of said clock signal supplied from said preceding semiconductor device and selectively outputting the sequence of resultant data signals in synchronous with said clock signal for every time period corresponding to one period of said clock signal.

12. A semiconductor apparatus according to claim 11, wherein said output circuit clock generating circuit for generating said second clock signal from said first clock signal and outputting said second clock signal as said clock signal to a subsequent semiconductor device.

13. A synchronous semiconductor device comprising:

an asynchronous circuit receiving a sequence of data signals supplied in synchronous with a first clock signal and outputting a sequence of resultant data signals based on the sequence of data signals;

an output circuit clock generating circuit for generating a second clock signal from said first clock signal; and an output synchronizing circuit for latching each resultant data signal for a time interval corresponding to twice of one period of said clock signal supplied from said preceding semiconductor device and selectively outputting the sequence of resultant data signals in synchronous with said clock signal for every time period corresponding to one period of said clock signal.

14. A synchronous semiconductor device according to claim 13, wherein said output circuit clock generating circuit includes a frequency dividing circuit for dividing said first clock signal in frequency such that differential clock signals as said second clock signal have a frequency twice of that of said first clock signal and phases inverse to each other, and wherein said output synchronizing circuit includes:

first latching means for latching a first resultant data signals of the sequence in response to one of said differential clock signals;

second latching means for latching a second resultant data signals of the sequence in response to the other of said differential clock signals, the sequence of resultant data signals being composed of the first resultant data signals and the second resultant data signals which are different from the first resultant data signals; and selecting means for alternately selecting the resultant data signals from said first and second latching means for every time interval corresponding to one period of said first clock signal in accordance with said differential clock signals.

15. A synchronous semiconductor device according to claim 14, wherein said output circuit clock generating circuit further includes delay means for delaying said first clock signal by a time interval corresponding to an operation time of said asynchronous circuit to supply the delayed first clock signal to said frequency dividing circuit.

16. A synchronous semiconductor device according to claim 14, said output synchronizing circuit further includes delay means for delaying said differential clock signals to be supplied to said selecting means by an operation time of said first and second latching means.

17. A synchronous semiconductor device according to claim 13, further comprising an input synchronizing circuit for latching the sequence of data signals in response to said first clock signal such that the sequence of latched data signals is supplied to said asynchronous circuit in synchronous with said first clock signal.

18. An synchronous semiconductor device according to claim 17, further comprising an input circuit clock generating circuit for delaying a fourth clock signal to generate said first clock signal from the fourth clock signal.

19. A synchronous semiconductor device according to claim 13, wherein said asynchronous circuit is a logic circuit.

20. A synchronous semiconductor device according to claim 13, wherein said asynchronous circuit is a semiconductor random access memory.

* * * * *

UNITED STATES PATENT AND TRADEMARK OFFICE
CERTIFICATE OF CORRECTION

PATENT NO.: 5,694,371
DATED: December 2, 1997
INVENTOR(S): Manabu KAWAGUCHI

It is certified that error(s) appears in the above-identified patent and that said Letters Patent is hereby corrected as shown below:

Col. 2, line 52, delete "CLK'" and insert --CLK"--.

Col. 3, line 27, delete "761" and insert --76-1--.

Col. 3, line 41, delete "$(t_{d\text{-}d\text{-'min}})$" and insert --$(t_{d'max} - t_{d'min})$--.

Col. 3, line 60, delete "tcyc" and insert --$t_{cyc}$--.

Col. 7, line 65, delete "182" and insert --18-2--.

Col. 8, line 4, delete "of the" (first occurrence).

Col. 9, line 43, delete "the" (second occurrence).

Signed and Sealed this

Sixteenth Day of March, 1999

Attest:

Q. TODD DICKINSON

*Attesting Officer*　　*Acting Commissioner of Patents and Trademarks*